United States Patent
Yu et al.

(10) Patent No.: US 11,631,443 B2
(45) Date of Patent: Apr. 18, 2023

(54) SEMICONDUCTOR DEVICE AND ELECTRONIC DEVICE WITH SERIAL, DATA TRANSFER MECHANISM

(71) Applicant: Samsung Electronics Co., Ltd., Suwon-si (KR)

(72) Inventors: Yong Jun Yu, Suwon-si (KR); Nam Hyung Kim, Seoul (KR); Do-Han Kim, Hwaseong-si (KR); Min Su Kim, Seongnam-si (KR); Deok Ho Seo, Suwon-si (KR); Won Jae Shin, Seoul (KR); Chang Min Lee, Hwaseong-si (KR); Il Gyu Jung, Hwaseong-si (KR); In Su Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/480,359

(22) Filed: Sep. 21, 2021

(65) Prior Publication Data
US 2022/0215866 A1 Jul. 7, 2022

(30) Foreign Application Priority Data
Jan. 5, 2021 (KR) .......................... 10-2021-0000862

(51) Int. Cl.
*G11C 7/10* (2006.01)
*G11C 7/22* (2006.01)

(52) U.S. Cl.
CPC ............ *G11C 7/1063* (2013.01); *G11C 7/109* (2013.01); *G11C 7/1039* (2013.01); *G11C 7/22* (2013.01)

(58) Field of Classification Search
CPC ..... G11C 7/1063; G11C 7/1039; G11C 7/109; G11C 7/22; G11C 7/1006; G11C 2207/105; G11C 11/4096; G11C 5/04; G11C 8/06; G11C 8/10; G06F 13/1668; G06F 13/4282; G06F 3/0614; G06F 3/0661; G06F 2213/0016
See application file for complete search history.

(56) References Cited

U.S. PATENT DOCUMENTS

| | | | |
|---|---|---|---|
| 9,449,659 B2 | 9/2016 | Brewer et al. | |
| 9,710,423 B2 * | 7/2017 | Sengoku | G06F 13/42 |
| 9,887,008 B2 | 2/2018 | Lee et al. | |
| 10,108,542 B2 | 10/2018 | Le et al. | |
| 10,585,843 B2 | 3/2020 | Kachare et al. | |
| 10,649,927 B2 | 5/2020 | Raghava et al. | |
| 2010/0142304 A1 | 6/2010 | Pyeon | |
| 2015/0234010 A1 * | 8/2015 | Kim | G01R 31/3187 714/735 |

* cited by examiner

*Primary Examiner* — Sultana Begum
(74) *Attorney, Agent, or Firm* — Harness, Dickey & Pierce, P.L.C.

(57) ABSTRACT

A semiconductor device including a memory device which has improved reliability is provided. The semiconductor device comprises at least one data pin configured to transfer a data signal, at least one command address pin configured to transfer a command and an address, at least one serial pin configured to transfer a serial data signal, and processing circuitry connected to the at least one data pin and the at least one serial pin. The processing circuitry is configured to receive the data signal from outside through the at least one data pin, and the processing circuitry is configured to output the serial data signal through the at least one serial pin in response to the received data signal.

20 Claims, 16 Drawing Sheets

SEMICONDUCTOR DEVICE AND ELECTRONIC DEVICE WITH SERIAL, DATA TRANSFER MECHANISM

This application claims priority from Korean Patent Application No. 10-2021-0000862 filed on Jan. 5, 2021 in the Korean Intellectual Property Office, the disclosure of which is incorporated herein by reference in its entirety.

BACKGROUND

Inventive concepts relate to a semiconductor device and/or an electronic device including the same. More specifically, inventive concepts relate to a semiconductor device including a memory device.

The semiconductor memory device may be divided into a non-volatile memory device such as a flash memory device and a volatile memory device such as a dynamic random access memory (DRAM). The volatile memory device such as the DRAM is relatively inexpensive and is therefore used to store large capacity of data such as a system memory.

A dual in-line memory module (DIMM) includes a plurality of DRAMs and may include terminals on both sides of a substrate to which the plurality of DRAMs are connected. The dual in-line memory module may operate by being installed on a memory slot on a main board. Recently, since the dual in-line memory module is equipped with an accelerator, the memory module may process the data transferred from the host. On the other hand, improvements in performance of the dual in-line memory module and the accelerator are being pursued.

SUMMARY

Some example embodiments of inventive concepts provide a semiconductor device including a memory device which has improved reliability.

Alternatively or additionally, some example embodiments of inventive concepts also provide an electronic device including a memory device which has improved reliability.

However, example embodiments of inventive concepts are not restricted to the one set forth herein. The above and other aspects of inventive concepts will become more apparent to one of ordinary skill in the art to which inventive concepts pertains by referencing the detailed description of inventive concepts given below.

According to some example embodiments of inventive concepts, the semiconductor device comprises at least one data pin configured to transfer a data signal, at least one command address pin configured to transfer a command and an address, at least one serial pin configured to transfer a serial data signal, and processing circuitry connected to the at least one data pin and the at least one serial pin. The processing circuitry is configured to receive the data signal from outside through the at least one data pin, and the processing circuitry is configured to output the serial data signal through the at least one serial pin in response to the received data signal.

According to some example embodiments of inventive concepts, the semiconductor device comprises a memory device, at least one data pin configured to transfer a first data signal from outside to the memory device during a first time interval, processing circuitry configured to receive the first data signal from the memory device, and at least one serial pin configured to transfer a computing command from the outside to the processing circuitry during a second time interval. The processing circuitry is configured to output a response signal based on the received first data signal and the computing command, and at least some of the first time interval and the second time interval overlap each other.

According to some example embodiments of inventive concepts, the electronic device comprises a host, first processing circuitry connected to the host, and a memory device connected to the first processing circuitry. The first processing circuitry includes at least one first data pin configured to receive a data signal from the host, a first interfacing device circuitry configured to receive a serial data signal from the host and to decode the serial data signal, and a computing processing circuitry configured to receive the decoded serial data signal from the first interfacing circuitry. The memory device includes a second interfacing device circuitry connected to the at least one first data pin and is configured to receive the data signal from the first data pin and to decode the data signal, and a memory module configured to receive the decoded data signal from the second interfacing device circuitry, to store the decoded data signal, and to provide the stored data signal to the computing processing circuitry. The computing processing circuitry is configured to output a response signal based on the received data signal and the serial data signal.

Other features and example embodiments may be apparent from the following detailed description, the drawings, and the claims.

BRIEF DESCRIPTION OF THE DRAWINGS

The above and other example embodiments and features of inventive concepts will become more apparent by describing in detail embodiments thereof with reference to the attached drawings, in which.

DETAILED DESCRIPTION OF EXAMPLE EMBODIMENTS

Hereinafter, embodiments according to the technical idea of inventive concepts will be explained referring to the accompanying drawings.

Figure 1:
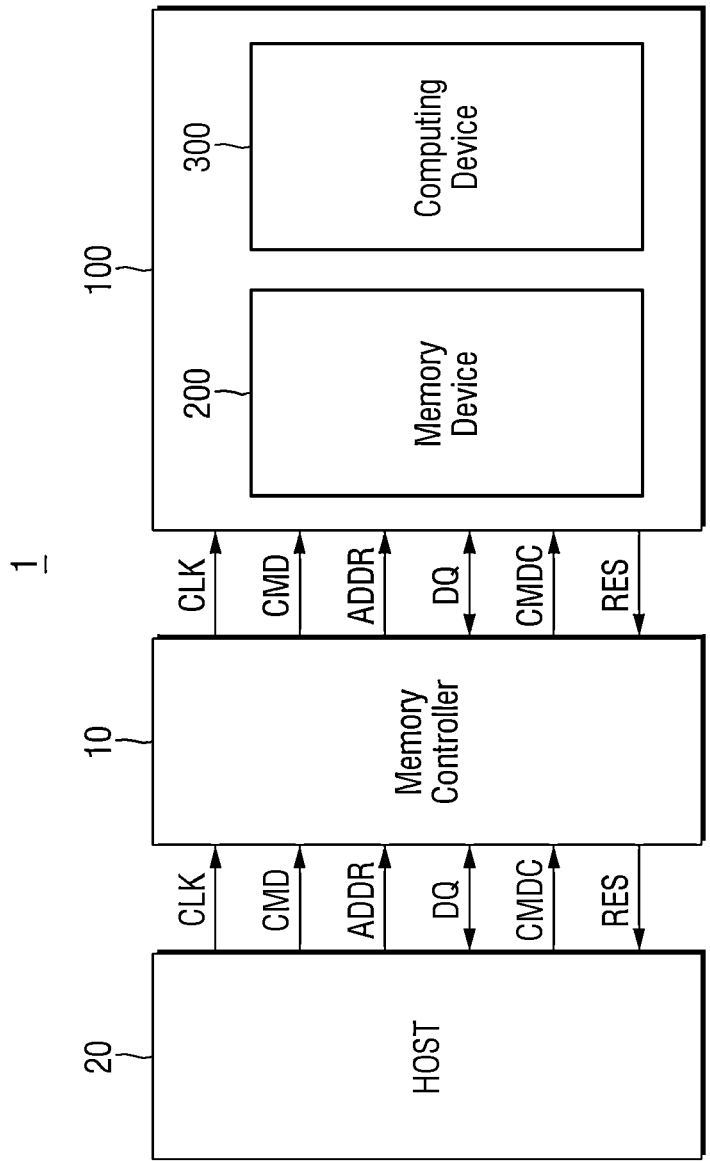
FIG. 1 is a block diagram of an electronic device according to some example embodiments.

FIG. 1 is a block diagram of an electronic device according to some example embodiments.

Referring to FIG. 1, the electronic device 1 according to some example embodiments may include a host 20, a memory controller 10, and a semiconductor device 100.

The host 20 may generally command and/or control the operation of the electronic device 1. The host 20 may apply an operation command for controlling the memory controller 10 and the semiconductor device 100 to control the semiconductor device 100. The host 20 may include, for example, at least one of a personal computer (PC), a laptop, a mobile phone, a smart phone, a tablet PC, and the like. The host 20 may include, for example, at least one of a central processing unit (CPU), a controller, or an application specific integrated circuit (ASIC).

The memory controller 10 may control a data exchange between the host 20 and the semiconductor device 100. The memory controller 10 may write data on the semiconductor device 100 and/or read data on the semiconductor device 100 in response to a request from the host 20. For example, the memory controller 10 provides the semiconductor device 100 with a clock signal CLK, a command CMD and an address ADDR, and may send and/or receive data signal DQ to and/or from the semiconductor device 100. The memory controller may provide a computing command CMDC transferred from the host 20 to the semiconductor device 100, and may provide a response signal RES transferred from the semiconductor device 100 to the host 20.

The memory controller 10 may include at least one of a central processing unit (CPU), a controller, or an application specific integrated circuit (ASIC) that performs the operation.

The semiconductor device 100 may include a memory device 200 and a computing device 300. The memory device 200 and the computing device 300 may be driven by the memory controller 10. For example, the memory device 200 may be driven by a clock signal CLK, a command CMD, an address ADDR, and the like transferred from the memory controller 10. The computing device 300 may be driven by the data signal DQ and the computing command CMDC transferred from the memory controller 10. The memory device 200 may provide the data signal DQ to the memory controller 10 in response to the command CMD transferred from the memory controller 10. The computing device 300 may provide the response signal RES to the memory controller 10 in response to the computing command CMDC. However, example embodiments of inventive concepts are not limited thereto.

Figure 2:
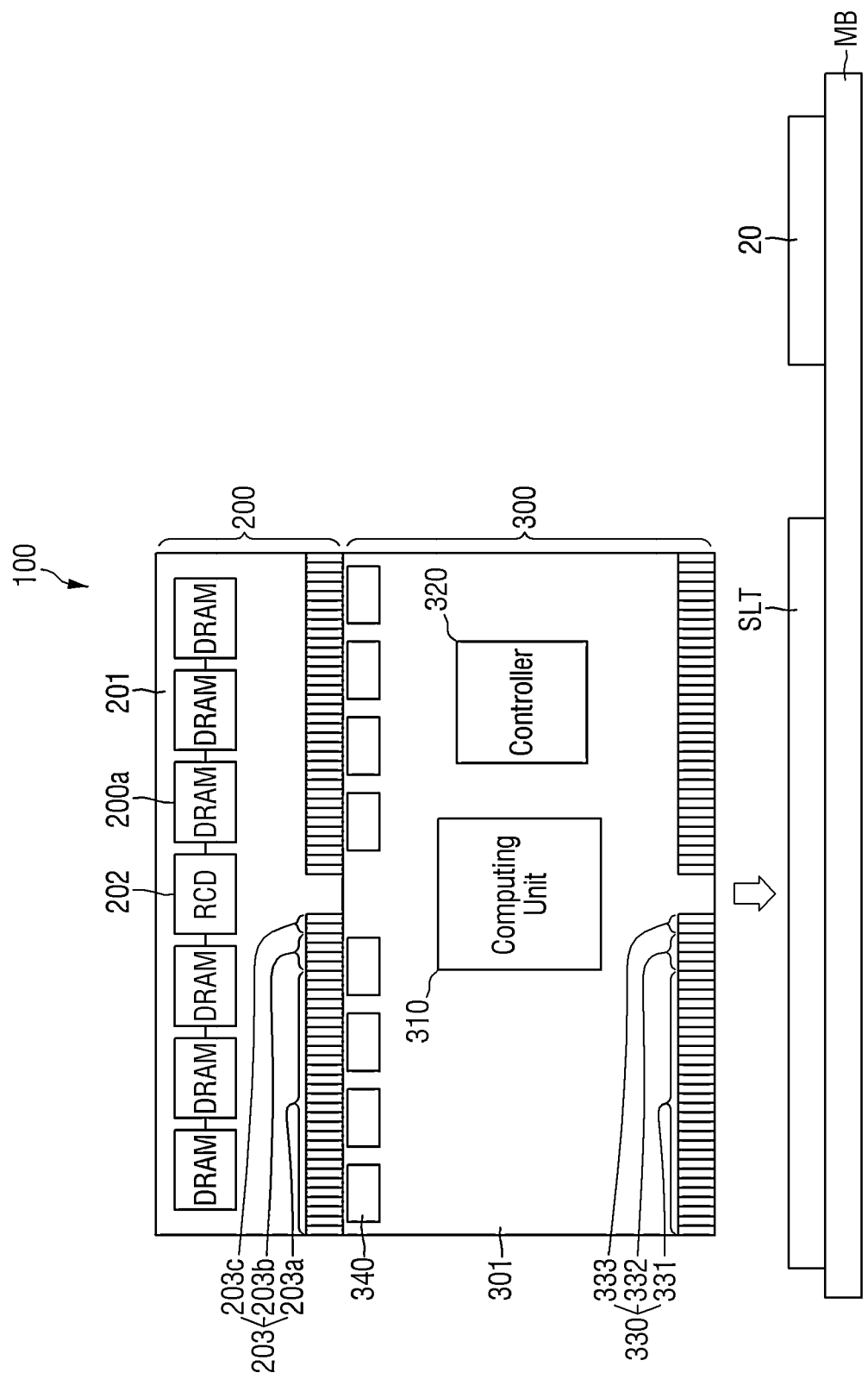
FIG. 2 is a diagram for explaining an electronic device according to some example embodiments.

FIG. 2 is a diagram for explaining an electronic device according to some example embodiments.

Referring to FIG. 2, the semiconductor device 100 may be installed on or in the memory slot SLT. Here, the memory slot SLT may be placed on a main board MB (or motherboard). Also, the host 20 may be placed on the main board MB. The host 20 and the memory slot SLT may be electrically connected through the main board MB. For example, the host 20 may be electrically connected to and communicate with the semiconductor device 100 through the memory slot SLT and the main board MB. The memory slot SLT may also be referred to as a memory socket.

The semiconductor device 100 may include a memory device 200 and a computing device 300 connected to each other. Here, the memory device 200 and the computing device 300 may be connected, e.g. directly connected and may be in direct contact with each other. For example, the semiconductor device 100 may mean the memory device 200 and the computing device 300 that are integrally connected. The semiconductor device 100 may correspond to a single semiconductor card.

The memory device 200 may be or may include or may be a part of a dual in-line memory module (DIMM). The memory device 200 may include a plurality of memory devices 200a. Here, the plurality of memory devices 200a may be arranged in a line such as in a row and may be connected to each other.

The memory device 200 may include a substrate 201, a register clock driver 202, a plurality of memory devices 200a, and connecting pins 203. The register clock driver 202, plurality of memory devices 200a, and the connecting pins 203 may be mounted on the substrate 201. Further, the register clock driver 202, the plurality of memory devices 200a, and the connecting pins 203 may be electrically connected by connecting devices included in the substrate 201. The substrate 201 may include a plate made of an insulator such as a plastic, and connecting devices connected to the register clock driver 202, the plurality of memory devices 200a, and the connecting pins 203.

The connecting pin 203 may be placed along the lower part of the substrate 201, and may be placed so that the upper surface of the connecting pin 203 is exposed. The connecting pin 203 may be connected to the computing device 300, and may allow the computing device 300 and the memory device 200 to be electrically connected. The connecting pin 203 may include a plurality of pins. For example, the connecting pin 203 may include a data pin 203a, a command address pin 203b, a serial pin 203c, and the like. Each pin of the connecting pin 203 may be placed at different positions of the substrate 201. For example, the data pin 203a may be placed in a lower outer portion of the substrate 201, and the serial pin 203c may be placed in a lower inner portion of the substrate 201. Also, the command address pin 203b may be placed between the data pin 203a and the serial pin 203c. For example, the data pin 203a, the command address pin 203b, and the serial pin 203c may be sequentially arranged from the outside of the lower part of the substrate 201. However, the embodiment of inventive concepts is not limited thereto, and the positions of the data pin 203a, the command address pin 203b, and the serial pin 203c may be different from these positions, and may or may not be adjacent to one another or contiguous with one another.

The register clock driver 202 (RCD) may be mounted on the substrate 201. The register clock driver 202 may be connected to the memory device 200a and the connecting pin 203 through wirings on the substrate 201. For example, the register clock driver 202 may be connected to the command address pin 203b and the serial pin 203c. Although the register clock driver 202 is not connected to the data pin 203a, example embodiments of inventive concepts are not limited thereto.

The register clock driver 202 may receive various signals from the host 20 through the address pin 203b and the command serial pin 203c. For example, the register clock driver 202 may receive the clock signal CLK, the command CMD, the address ADDR, and/or the like through the command address pin 203*b*. The register clock driver 202 may provide the clock signal CLK, the command CMD, the address ADDR, and the like to a plurality of memory devices 200*a*. Here, the memory device 200 including the register clock driver 202 may operate on the basis of a RDIMM (a registered DIMM).

The plurality of memory devices 200*a* may be placed on either side of the register clock driver 202. The plurality of memory devices 200*a* may be arranged linearly, e.g. in a row and may be electrically connected to the register clock driver 202. For example, the memory devices 200*a* may be connected to the register clock driver 202 by the connection line of the substrate 201. Also, the plurality of memory devices 200*a* may be connected to the data pin 203*a*. Although it is not shown in the drawing, a decoder that interfaces a data signal DQ may exist between the plurality of memory devices 200*a* and the data pins 203*a*. For example, the decoder may decode the data signal DQ transferred from the data pin 203*a* according to the DIMM protocol, and may transfer the decoded data signal DQ to the memory device 200*a*. However, example embodiments of inventive concepts are not limited thereto, and the memory device 200*a* may be directly connected to the data pin 203*a*. Furthermore, the number of memory devices 200*a* may be more than, or less than, the number illustrated in FIG. 2. For example, one or more of the memory devices 200*a* may be or serve as a parity device, representing the parity of others of the plurality of memory devices 200*a*.

The memory device 200*a* may also output the data signal DQ and transfer it to the data pin 203*a*. That is, the memory device 200*a* may operate on the basis of the command CMD and the address ADDR transferred from the command address pin 203*b* and the register clock driver 202, and the data signal DQ transferred from the data pin 203*a*.

The memory device 200*a* may include various memories such as at least one of dynamic random access memory (DRAM), a phase change random access memory (PRAM), a ferroelectric random access memory (FRAM), a magnetic random access memory (MRAM), a resistive random access memory (RRAM), and a flash memory.

Furthermore the memory devices 200*a* may be all the same memory, or, alternatively may be different memories. For example, some of the memory devices 200*a* may be DRAM devices, and some others of the memory devices 200*a* may be FRAM devices; however, example embodiments are not limited thereto. As described herein, the memory device 200*a* will be described on the premise that each of the memory devise is a DRAM.

The computing device 300 may be directly connected to the memory device 200. For example, the computing device 300 may be directly connected to the connecting pin 203 of the memory device 200. The computing device 300 may send and/or receive data to and/or from the memory device 200 through the connecting pins 203. The semiconductor device 100 may operate integrally when the computing device 300 and the memory device 200 send and receive data through the connecting pins 203.

The computing device 300 may include a substrate 301, a computing unit 310, a controller 320, a connecting pin 330, a multiplexer 340, and the like. The computing unit 310, the controller 320, the connecting pin 330 and the multiplexer 340 may be mounted on the substrate 301. Further, the computing unit 310, the controller 320, the connecting pin 330 and the multiplexer 340 may be electrically connected by the connecting devices included in the substrate 301. The substrate 301 may include a plate made of or including an insulator such as a plastic, and connecting devices connected to the computing unit 310, the controller 320, the connecting pin 330 and the multiplexer 340.

The connecting pin 330 may be placed along the lower part of the substrate 301. The connecting pin 330 may be connected to the memory slot SLT, and may allow the host 20 and the computing device 300 to be electrically connected. The connecting pin 330 may include a plurality of pins. For example, the connecting pin 330 may include a data pin 331, a command address pin 332, a serial pin 333, and the like. Each pin of the connecting pin 330 may be placed at different positions of the substrate 301. For example, the data pin 331 may be placed in the lower outer portion of the substrate 301, and the serial pin 333 may be placed in the lower inner portion of the substrate 301. Also, the command address pin 332 may be placed between the data pin 331 and the serial pin 333. For example, the data pin 331, the command address pin 332, and the serial pin 333 may be sequentially arranged from the outside of the lower part of the substrate 301. However, example embodiments of inventive concepts are not limited thereto, and the positions of the data pin 331, the command address pin 332 and the serial pin 333 may be different from these positions.

Furthermore the data pin 331, the command address pin 332, and the serial pin 333 may or may not be contiguous among themselves. For example, although FIG. 2 illustrates that each of the data pins 331 are arranged adjacent to one another with no command address pin 332 therebetween, example embodiments are not limited thereto.

The computing unit 310 may be mounted in the central part of the substrate 301. The computing unit 310 may be connected to the controller 320, the multiplexer 340 and the connecting pin 330, and may process and/or output the received signal. The computing unit 310 may be or may include an accelerator. For example, the computing unit 310 may be or may include an FPGA (field programmable gate array) programmed according to a specific method. The computing unit 310 may process the data provided under the control of the controller 320 and output it to the host 20.

The multiplexer 340 may be placed along a part, such as the upper part of the substrate 301. The multiplexer 340 may connect the connecting pin 330 and the connecting pin 203. For example, the semiconductor device 100 may be electrically connected to the host 20 through the multiplexer 340, the connecting pin 330, and the connecting pin 203. For example, at least one of the data pins 331 of the computing device 300 may be connected to at least one of the data pins 203*a* of the memory device 200 through the multiplexer 340. The command address pin 332 of the computing device 300 may be connected to the command address pin 203*b* of the memory device 200 through the multiplexer 340. The serial pin 333 of the computing device 300 may be connected to the serial pin 203*c* of the memory device 200 through the multiplexer 340. Although it is not shown in the drawing, the computing device 300 may have a decoder that interfaces the transferred signal and is connected to the connecting pin 330.

Here, the serial pin 333 in the connecting pin 330 may be connected to the computing unit 310, and the data pin 203*a* in the connecting pin 203 may be connected to the computing unit 310 through the multiplexer 340. The computing unit 310 may receive the data signals through the serial pin 333 and the data pin 203*a*. More detailed contents thereof will be given later.

Figure 3:
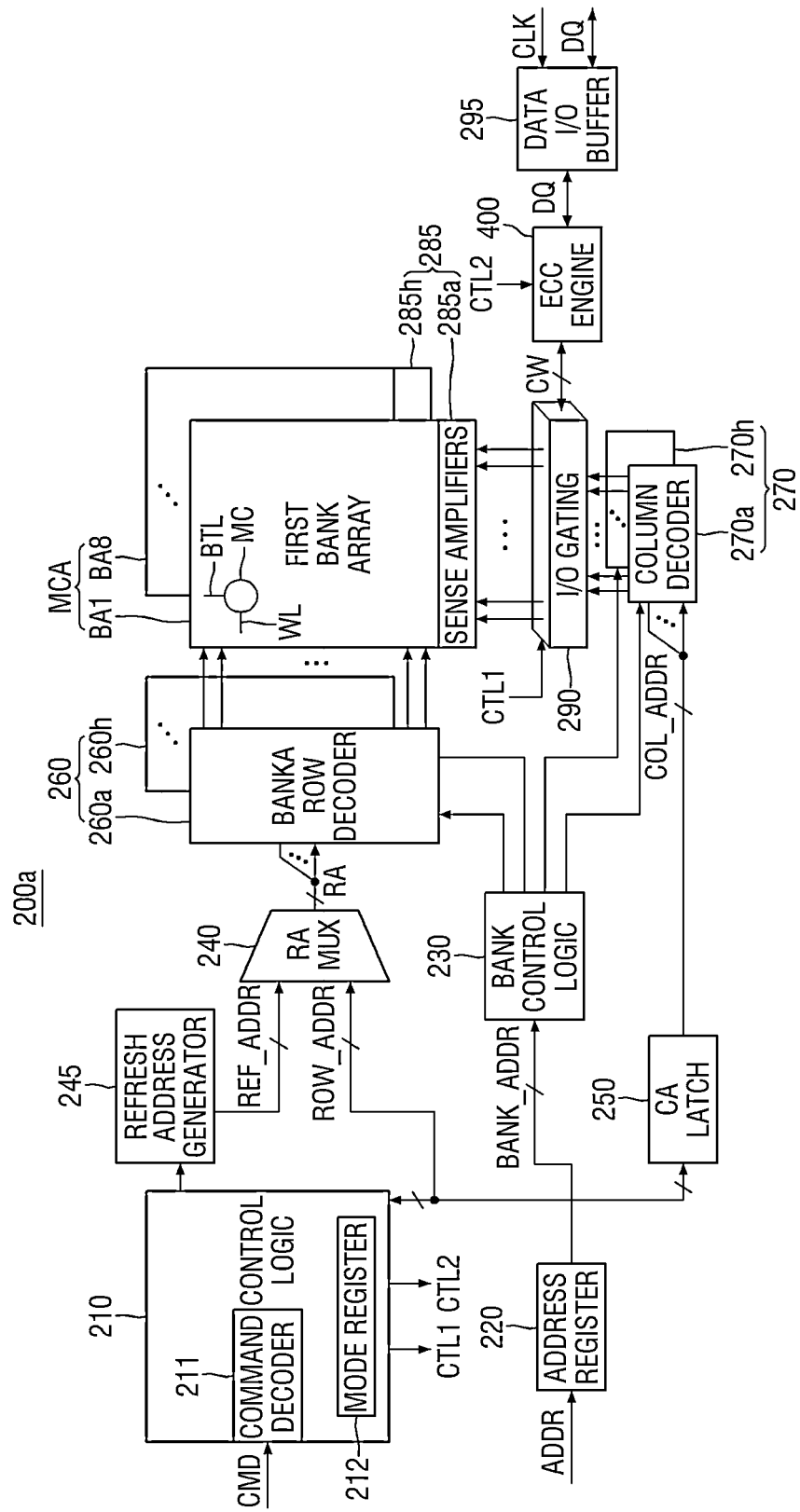
FIG. 3 is a block diagram of a memory device according to some example embodiments.

FIG. 3 is a block diagram of a memory device according to some example embodiments.

Referring to FIG. 3, the memory device 200a includes a control logic 210, an address register 220, a bank control logic 230, a row address multiplexer 240, a refresh address generator 245, a column address latch 250, a row decoder 260, a column decoder 270, a sense amplifier 285, an I/O gating circuit 290, a memory cell array MCA, an ECC engine 400, a data I/O buffer 295.

The memory cell array MCA may include a plurality of memory cells MC for storing data. For example, the memory cell array MCA may include a plurality of banks such as first to eighth bank arrays BA1 to BA8. Each of the first to eighth bank arrays BA1 to BA8 may include a plurality of word lines WL (e.g. a plurality of row lines), a plurality of bit lines BTL (e.g. a plurality of column lines), and a plurality of memory cells MC formed or arranged at the intersection between the word lines WL and the bit lines BTL.

The plurality of memory cells MC may include or be arranged in first to eighth bank arrays BA1 to BA8. Although FIG. 3 shows a memory device 200a including the eight bank arrays BA1 to BA8, example embodiments are not limited thereto, and the memory device 200a may include an arbitrary number of bank arrays.

The control logic 210 may control the operation of the memory device 200a. For example, the control logic 210 may generate control signals such that the memory device 200a performs an operation of writing the data and/or an operation of reading the data. The control logic 210 may include a command decoder 211 that decodes the command CMD received from the memory controller 10, and a mode register 212 for setting the operating mode of the memory device 200a.

For example, the command decoder 211 may decode a write enable signal, a row address strobe signal, a column address strobe signal, a chip selection signal, and the like to generate control signals corresponding to the command CMD. The control logic 210 may also receive a clock signal CLK and a clock enable signal for driving the memory device 200a in a synchronous manner.

Further, the control logic 210 may control the refresh address generator 245 to generate a refresh row address REF_ADDR in response to a refresh command. However, example embodiments are not limited thereto, and there may or may not be a refresh address generator 245. For example, in a situation wherein the memory cells MC are non-volatile memory cells such as PRAM cells, there may not be a refresh address generator 245.

The address register 220 may receive the address ADDR from the memory controller 10. For example, the address register 220 may receive the address ADDR including a bank address BANK_ADDR, a row address ROW_ADDR, and a column address COL_ADDR. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR received from the address register 220. In response to these bank control signals, the bank row decoder corresponding to the bank address BANK_ADDR among the first to eighth bank row decoders 260a to 260h is activated, and the bank column decoder corresponding to the bank address BANK_ADDR among the first to eighth decoder column decoders 270a to 270h may be activated.

The row address multiplexer 240 may receive the row address ROW_ADDR from the address register 220, and may receive the refresh row address REF_ADDR from the refresh address generator 245. The row address multiplexer 240 may selectively output the row address ROW_ADDR received from the address register 220 or the refresh row address REF_ADDR received from the refresh address generator 245, as the row address RA. The row address RA output from the row address multiplexer 240 may be applied to each of the first to eighth bank row decoders 260a to 260h.

The refresh address generator 245 may generate a refresh row address REF_ADDR for refreshing the memory cells. The refresh address generator 245 may provide the refresh row address REF_ADDR to the row address multiplexer 240. As a result, the memory cells placed/arranged in the word line corresponding to the refresh row address REF_ADDR may be refreshed.

The column address latch 250 may receive the column address COL_ADDR from the address register 220 and temporarily store the received column address COL_ADDR. Also, the column address latch 250 may gradually increase the received column address COL_ADDR in a burst mode. The column address latch 250 may apply a temporarily stored or gradually increased column address COL_ADDR to each of the first to eighth bank column decoders 270a to 270h.

The row decoder 260 may include the first to eighth bank row decoders 260a to 260h connected to each of the first to eighth bank arrays BA1 to BA8. The column decoder 270 may include first to eighth bank column decoders 270a to 270h connected to each of the first to eighth bank arrays BA1 to BA8. The sense amplifier 285 may include first to eighth bank sense amplifiers 285a to 285h connected to each of the first to eighth bank arrays BA1 to BA8.

The bank row decoder activated by the bank control logic 230 among the first to eighth bank row decoders 260a to 260h may decode the row address RA output from the row address multiplexer 240 to activate the word line corresponding to the row address RA. For example, the activated bank row decoder may apply a word line drive voltage to the word line corresponding to the row address RA.

The bank column decoder activated by the bank control logic 230 among the first to eighth bank column decoders 270a to 270h may activate the bank sense amplifiers 285a to 285h corresponding to the bank address BANK_ADDR and the column address COL_ADDR through the I/O gating circuit 290.

The I/O gating circuit 290 may include an input data mask logic, read data latches for storing the data output from the first to eighth bank arrays BA1 to BA8, and write drivers for writing data on the first to eighth bank arrays BA1 to BA8, together with the circuits for gating the I/O data.

A code word CW to be read from one of the first to eighth bank arrays BA1 to BA8 may be detected by the bank sense amplifiers 285a to 285h corresponding to the one bank arrays, and may be stored in the read data latches. The ECC engine 400 may perform ECC decoding on the code word CW stored in the read data latches. When an error is detected in the code word CW data, the ECC engine 400 may provide the corrected data signal DQ to the memory controller 10 through the data I/O buffer 295.

The data signal DQ to be written on or in one of the first to eighth bank arrays BA1 to BA8 is provided to the ECC engine 400, the ECC engine 400 generates parity bits on the basis of the data signal DQ and provide the data signal DQ and the parity bits to the I/O gating circuit 290, and the I/O gating circuit 290 may write the data signal DQ and the parity bits to a subpage of the one bank array through the write drivers.

The data I/O buffer 295 may provide the data signal DQ to the ECC engine 400 on the basis of the clock signal CLK provided from the memory controller 10 in the write operation, and may provide the data signal DQ provided from the ECC engine 400 to the memory controller 10 in the read operation.

Here, the data signal DQ may be transferred from the host 20 to the memory device 200*a* through the data pin 203*a*, and the command CMD and the address ADDR may be transferred from the host 20 to the memory device 200*a* through the command address pin 203*b*. For example, the command CMD and the address ADDR may be transferred to the register clock driver 202 through the command address pin 203*b*, and the register clock driver 202 may transfer the command CMD and the address ADDR to the memory device 200*a*. Further, the memory device 200*a* may send and receive data to and from the host 20 through the serial pin 203*c* and the serial pin 333. For example, data sent to and/or received from the host 20 through the serial pin 203*c* and the serial pin 333 may be data about a physical property of the memory device 200*a* such as about the temperature of the memory device 200*a*. However, example embodiments of inventive concepts are not limited thereto.

Figure 4:
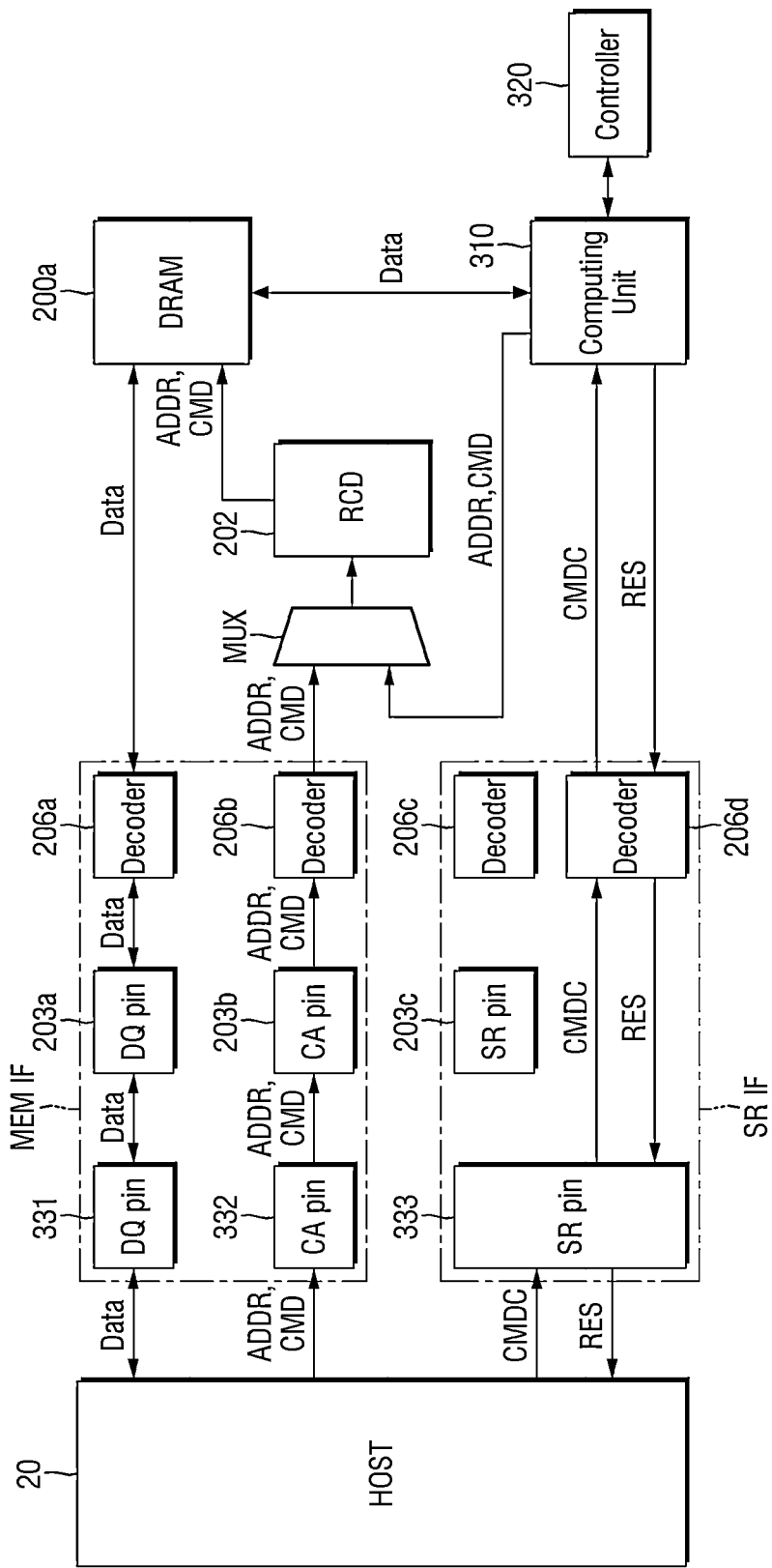
FIG. 4 is a block diagram of an electronic device according to some example embodiments.

FIG. 4 is a block diagram of an electronic device according to some example embodiments.

Referring to FIGS. 1 to 4, the electronic device may include a memory interface MEM IF and a serial interface SR IF. The memory interface MEM IF and the serial interface SR IF may transmit and/or receive data between the host 20 and the semiconductor device 100. For example, the data sent and received between the host 20 and the semiconductor device 100 may be interfaced by the memory interface MEM IF and the serial interface SR IF. The memory interface MEM IF and the serial interface SR IF may connect the host 20, the memory device 200, and the computing device 300.

The memory interface MEM IF may include at least one data pin 331, at least one data pin 203*a*, a decoder 206*a*, at least one command address pin 332, at least one command address pin 203*b*, a decoder 206*b*, and the like. Here, the data pin 331 and the command address pin 332 may be included in the computing device 300, and the data pin 203*a*, the data pin 203*b*, the decoder 206*a* and the decoder 206*b* may be included in the memory device 200. However, example embodiments of inventive concepts are not limited thereto, and the decoder 206*a* for decoding the data signal Data may be included in the computing device 300, and the decoder 206*b* for decoding the command CMD and the address ADDR may be included in the computing device 300. Here, the data signal Data may correspond to the data signal DQ described above. For example, the data signal Data may include data transferred through the memory interface MEM IF.

The data pin 331, the data pin 203*a* and the decoder 206*a* of the memory interface MEM IF may transmit and/or receive the data signal Data. For example, the data pin 331, the data pin 203*a* and the decoder 206*a* may transfer the data signal Data provided from the host 20 to the memory device 200*a*. Further, the data pin 331, the data pin 203*a* and the decoder 206*a* may transfer the data signal Data provided from the memory device 200*a* to the host 20 or the memory controller 10. Here, the decoder 206*a* may decode the data signal Data according to a memory protocol (e.g., a DDR protocol and/or a DIMM protocol). For example, the data signal Data may be or may include or be included in a signal interfaced according to the memory protocol. However, example embodiments of inventive concepts are not limited thereto, and the data signal Data may be decoded in another manner.

The command address pin 332, the command address pin 203*b* and the decoder 206*b* of the memory interface MEM IF may transfer the address ADDR and the command CMD. For example, the command address pin 332, the command address pin 203*b* and the decoder 206*b* may transfer the address ADDR and the command CMD provided from the host 20 to the register clock driver 202 of the memory device 200*a*. Here, the address ADDR and the command CMD output from the decoder 206*b* may be transferred to the register clock driver 202 through the multiplexer MUX. For example, the multiplexer MUX may selectively transfer one of the address ADDR and the command CMD output from the decoder 206*b* and the address ADDR and the command CMD transferred from the computing unit 310 to the register clock driver 202. The address ADDR and the command CMD transferred to the register clock driver 202 through the multiplexer MUX may be decoded by the decoder 206*b*. Here, the decoder 206*b* may decode the address ADDR and the command CMD according to the memory protocol (e.g., a DDR protocol or a DIMM protocol). However, example embodiments of inventive concepts are not limited thereto, and the address ADDR and the command CMD may be decoded in another manner.

The serial interface SR IF may include at least one serial pin 333, at least one serial pin 203*c*, a decoder 206*c*, a decoder 206*d*, and the like. Here, the serial pin 333 and the decoder 206*d* may be included in the computing device 300, and the serial pin 203*c* and the decoder 206*c* may be included in the memory device 200. However, example embodiments of inventive concepts are not limited thereto, and the decoder 206*c* and the decoder 206*d* may be included in the computing device 300. The serial interface SR IF may be separated from the memory interface MEM IF. For example, although the serial interface SR IF may be physically separated from the memory interface MEM IF, example embodiments of inventive concepts are not limited thereto.

The serial pin 333, the serial pin 203*c* and the decoder 206*c* may provide the signal output from the register clock driver 202 to the host 20. In the drawings according to example embodiments of inventive concepts, the signals transferred through the serial pin 203*c* and the decoder 206*c* are omitted. However, example embodiments of inventive concepts are not limited thereto. The signal transferred here may include data about the physical properties of the memory device 200 such as temperature data of the memory device 200 and the like. Further, the transferred signal may be decoded and transferred in a serial manner. For example, the signal transferred through the serial interface SR IF may be interfaced with the data signal Data transferred through the memory interface MEM IF in another manner. The serial interface SR IF may include an I2C interface or an I3C interface.

The serial pin 333 and the decoder 206*d* may transfer the computing command CMDC provided from the host 20 to the computing unit 310. Here, the computing command CMDC may be decoded by the decoder 206*d* in a serial manner. For example, the computing command CMDC may be transferred to the computing unit 310 in a serial manner. The decoder 206*d* may be included in the computing device 300. The serial pin 333 and the decoder 206*d* may transfer the response signal RES provided from the computing unit 310 to the host 20. Here, the response signal RES may be decoded by the decoder 206*d* in a serial manner. The computing unit 310 may output the response signal RES in response to the computing command CMDC. For example, the serial interface SR IF may be separated from the memory interface MEM IF, and data may be exchanged between the host 20 and the computing unit 310.

The computing unit 310 may receive the data signal Data from the memory device 200a. Here, the memory device 200a may provide the stored data signal Data to the computing unit 310. The data signal Data may be transferred to the computing unit 310 through the multiplexer 340 and the data pin 203a. Further, the computing unit 310 may receive the computing command CMDC from the serial pin 333 and the decoder 206d. The computing command CMDC may include information about computation of the data signal Data. For example, the host 20 may generate the computing command CMDC for operating the computing unit 310 and provide it to the semiconductor device 100. The computing unit 310 may perform computation on the data signal Data on the basis of the computing command CMDC. For example, the computing unit 310 may analyze the provided data signal Data and output a response signal RES thereof. For example, the computing unit 310 may output the response signal RES in response to the computing command CMDC and the data signal Data.

The computing unit 310 may transfer the response signal RES to the host 20 through the serial interface SR IF. The response signal RES may be transferred to the host 20 through the decoder 206d and the serial pin 333. The host 20 may receive the response signal RES and make a determination about the operation of the semiconductor device 100. Further, the host 20 may provide the data signal Data, the computing command CMDC, and/or the like to the semiconductor device 100 in response to the response signal CMDC. However, example embodiments of inventive concepts are not limited thereto.

The computing unit 310 may transfer the address ADDR and the command CMD to the multiplexer MUX through the memory interface MEM IF. The address ADDR and the command CMD transferred to the multiplexer MUX may be selectively transferred to the register clock driver 202 and the memory device 200a. In this case, the data signal Data output from the computing unit 310 may be transferred to the memory device 200a, and the memory device 200a may store the data signal Data on the basis of the address ADDR and the command CMD. Additionally or alternatively, the memory device 200a may provide the data signal Data to the computing unit 310 in response to the address ADDR and the command CMD.

Figure 5:
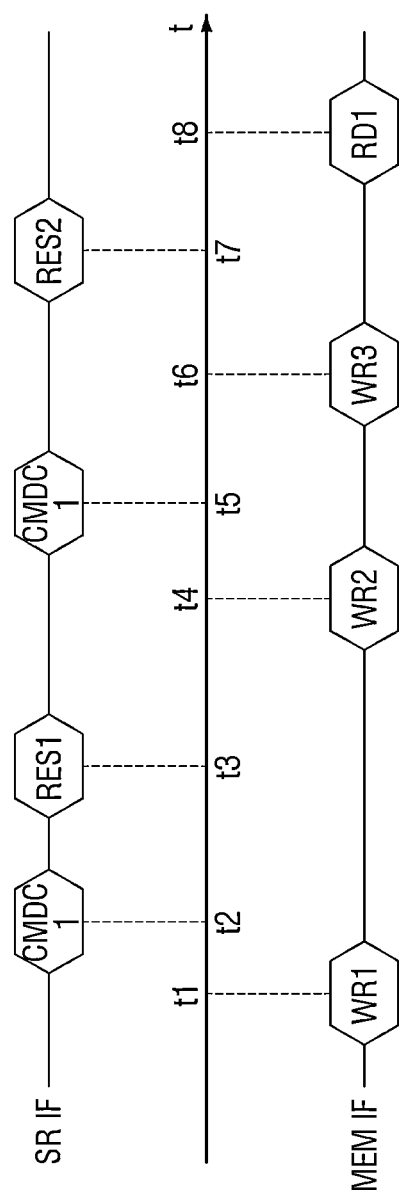
FIG. 5 is a timing diagram for explaining the operation of the electronic device according to some example embodiments.
Figure 6:
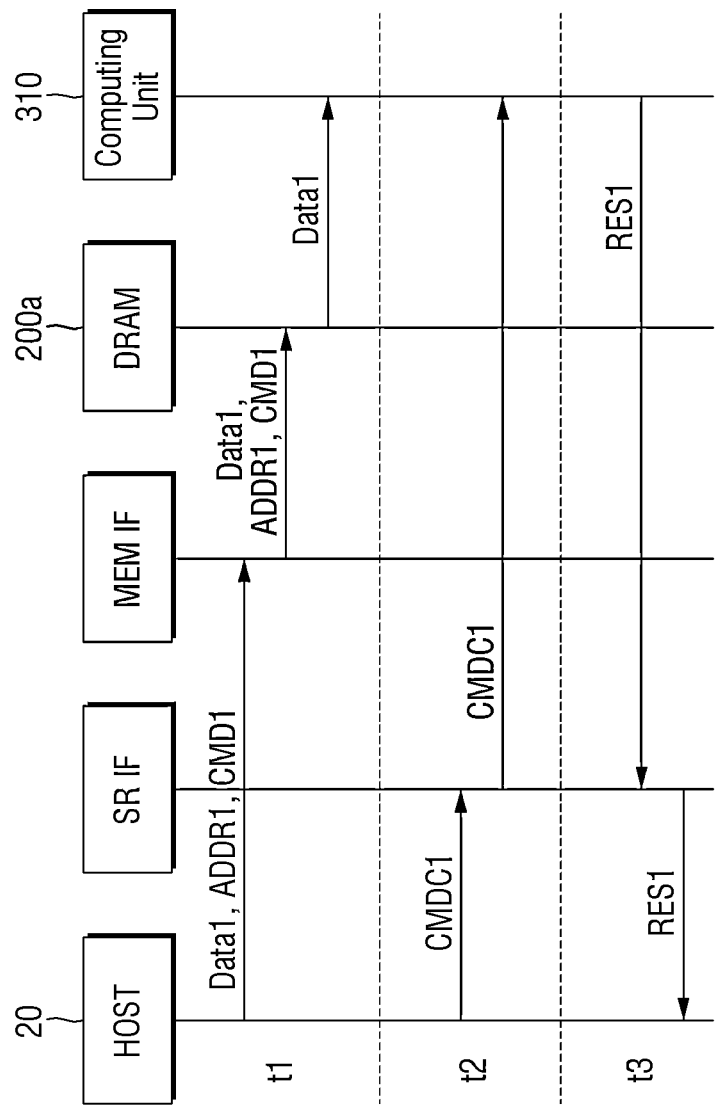
FIG. 6 is a ladder diagram for explaining the operation of the electronic device according to some example embodiments.
Figure 7:
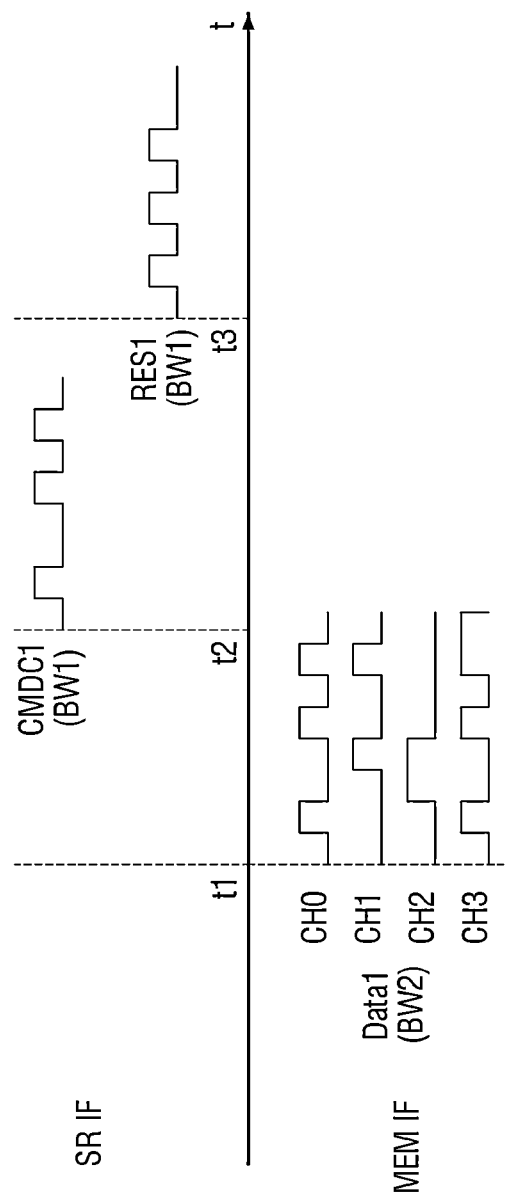
FIG. 7 is a timing diagram for explaining signals according to some example embodiments.

FIG. 5 is a timing diagram for explaining the operation of the electronic device according to some example embodiments. FIG. 6 is a ladder diagram for explaining the operation of the electronic device according to some example embodiments. FIG. 7 is a timing diagram for explaining signals according to some example embodiments.

Referring to FIGS. 1 to 7, a plurality of signals CMDC1, RES1, CMDC2, RES2, WR1, WR2, WR3, and RD1 may be transferred through a plurality of interfaces, for example, the serial interface SR IF and the memory interface MEM. For example, the plurality of signals CMDC1, RES1, CMDC2, and RES2 may be transferred through the serial interface SR IF, and the plurality of signals WR1, WR2, WR3, and RD1 may be transferred through the memory interface MEM IF. For example, the signals may be transferred through interfaces different from one another. Also, the signals transferred through different interfaces may not be limited to transmission timing. For example, the first command CMDC1 may be transferred at a second time t2 during a time interval at which the first signal WR1 is transferred at the first time t1. For example, the time interval at which the first signal WR1 is transferred may overlap the time interval at which the first command CMDC1 is transferred. For example, the signals transferred through each interface may not be dependent upon each other. For example, each interface may independently transfer the signals.

Referring to FIGS. 4 to 6, at the first time t1, the first data signal Data1, the first address ADDR1, and the first command CMD1 may be transferred to the computing unit 310 through the memory interface MEM IF. For example, the host 20 may transfer the first data signal Data1, the first address ADDR1, and the first command CMD1 to the memory device 200a through the memory interface MEM IF. In this case, the first data signal Data1 may be transferred to the memory device 200a through at least one data pin 331, at least one data pin 203a, the decoder 206a, and the like, and the first address ADDR1 and the first command CMD1 may be transferred to the memory device 200a through at least one command address pin 332, at least one command address pin 203b, the decoder 206b and the register clock driver 202. The memory device 200a may store the first data signal Data1 on the basis of the transferred first address ADDR1 and the first command CMD1. Further, the memory device 200a may provide the stored first data signal Data1 to the computing unit 310. The first data signal Data1 may be transferred to the computing unit 310 through the memory interface MEM IF.

At the second time t2, the first computing command CMDC1 may be transferred to the computing unit 310 through the serial interface SR IF. For example, the host 20 may transfer the first computing command CMDC1 to the computing unit 310 through the serial interface SR IF. Here, the second time t2 may be subsequent to the first time t1. Further, the time interval at which the first data signal Data1 is transferred may overlap the time interval at which the first computing command CMDC1 is transferred. However, example embodiments of inventive concepts are not limited thereto. The first computing command CMDC1 may be transferred to the computing unit 310 through the serial pin 333 and the decoder 206d. At this time, the first computing command CMDC1 may be transferred to the computing unit 310 without going through, e.g. bypassing, the memory device 200a. Further, the first computing command CMDC1 may be transferred to the computing unit 310 without going through the memory interface MEM IF.

At the third time t3, the first response signal RES1 may be transferred to the host 20 through the serial interface SR IF. For example, the computing unit 310 may transfer the first response signal RES1 to the host 20 through the serial interface SR IF. The third time t3 may be subsequent to, e.g. after or immediately after, the second time t2. The computing unit 310 may generate the response signal RES1 on the basis of the first data signal Data1 transferred at the first time t1 and the first computing command CMDC1 transferred at the second time t2. Here, the first response signal RES1 may indicate the determination result on the first data signal Data1 of the computing unit 310. For example, the host 20 may receive the first response signal RES1 and determine the response to the first data signal Data1.

Referring now to FIG. 7, the first data signal Data1 is transferred through the memory interface MEM IF at the first time t1, the first computing command CMDC1 is transferred through the serial interface SR IF at the second time t2, and the first response signal RES1 may be transferred through the serial interface SR IF at the third time t3. Here, a first bandwidth BW1 of the signal transferred through the serial interface SR IF may be smaller than/less than a second bandwidth BW2 of the signal transferred through the memory interface MEM IF. Because the first data signal Data1 is transferred through the plurality of channels CH0, CH1, CH2, and CH3, the second bandwidth BW2 may be smaller than the first bandwidth BW1. However, example embodiments of inventive concepts are not limited thereto.

The first computing command CMDC1 and the first response signal RES1 transferred through the serial interface SR IF may be interfaced in a serial manner, and first the first data signal Data1 transferred through the memory interface MEM IF may be interfaced in a manner other than the serial manner. However, example embodiments of inventive concepts are not limited thereto.

Because different signals are transferred through different interfaces, the semiconductor device 100 does not need to arbitrate the transmission order of the data signal Data, the computing command CMDC, the response signal RES, and the like. Alternatively or additionally, since it is not necessary to design a logic circuit that determines the transmission order of the data signal Data, the computing command CMDC, the response signal RES, and the like, the logic may be simplified and a signal delay may be reduced. As a result, the reliability of the semiconductor device 100 that transmits the signals through the memory interface MEM IF and the serial interface SR IF may be improved.

Hereinafter, the electronic device 1 according to some example embodiments will be explained referring to FIGS. 8 to 10.

Figure 8:
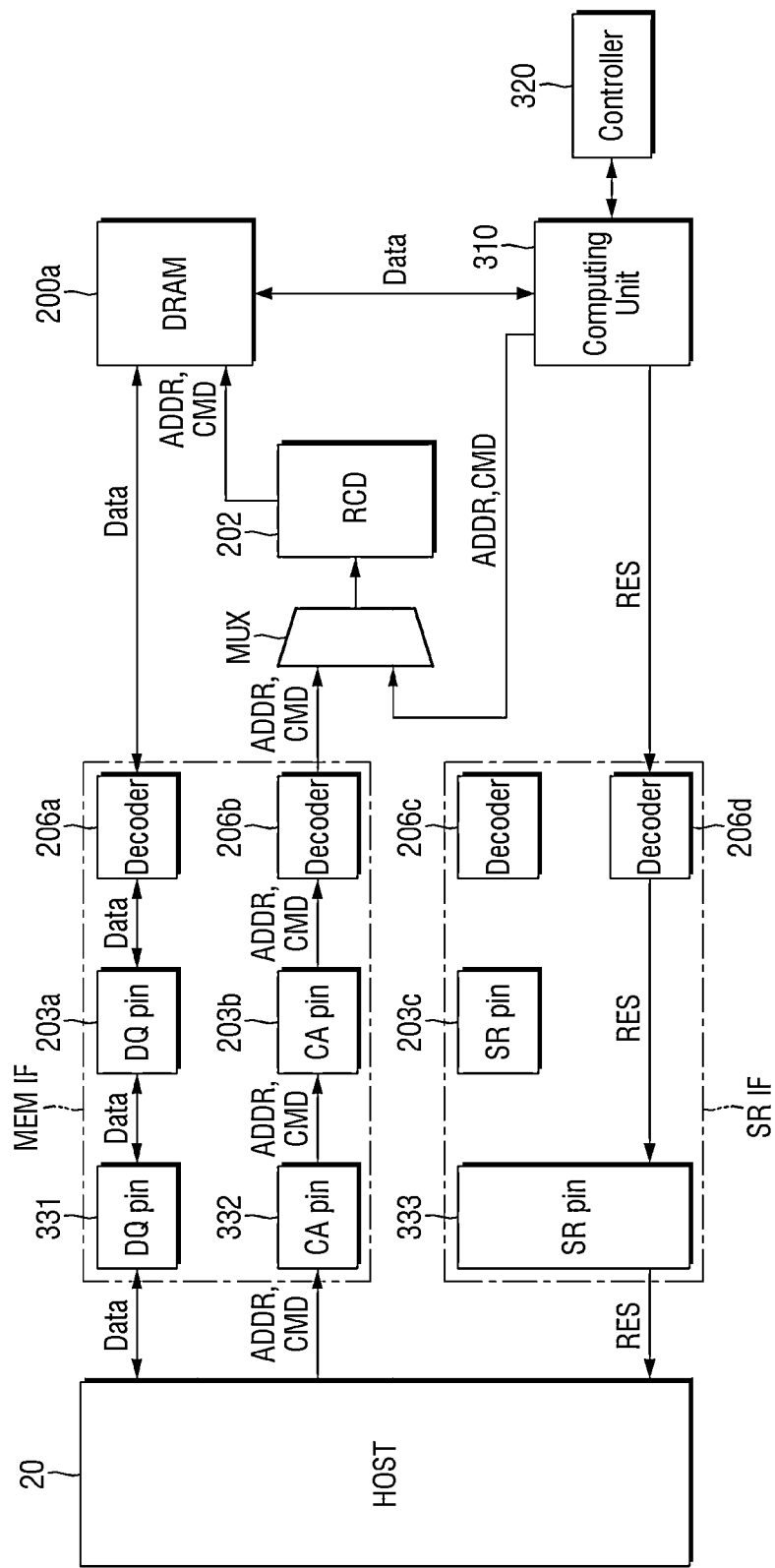
FIG. 8 is a block diagram of an electronic device according to some example embodiments.

FIG. 8 is a block diagram of an electronic device according to some example embodiments. FIG. 9 is a timing diagram for explaining the operation of the electronic device according to some example embodiments. FIG. 10 is a ladder diagram for explaining the operation of the electronic device according to some example embodiments. For convenience of explanation, repeated parts of contents explained using FIGS. 1 to 7 will be briefly explained or omitted.

Referring to FIG. 8, the electronic device 1 may include a host 20, a memory interface MEM IF, a serial interface SR IF, a memory device 200a, a computing unit 310, and the like. The serial interface SR IF may include a serial pin 333, a serial pin 203c, a decoder 206c, a decoder 206d, and the like. Unlike the serial interface SR IF explained referring to FIGS. 1 to 7, the serial interface SR IF of FIG. 8 may not transfer the computing command CMDC. For example, the host 20 may not provide the computing command CMDC to the serial interface SR IF, and the computing unit 310 may not receive the computing command CMDC from the serial interface SR IF.

The serial pin 333 and the decoder 206d of the serial interface SR IF may interface the response signal RES provided from the computing unit 310. For example, the serial pin 333 and the decoder 206d may transfer the response signal RES to the host 20.

Figure 9:
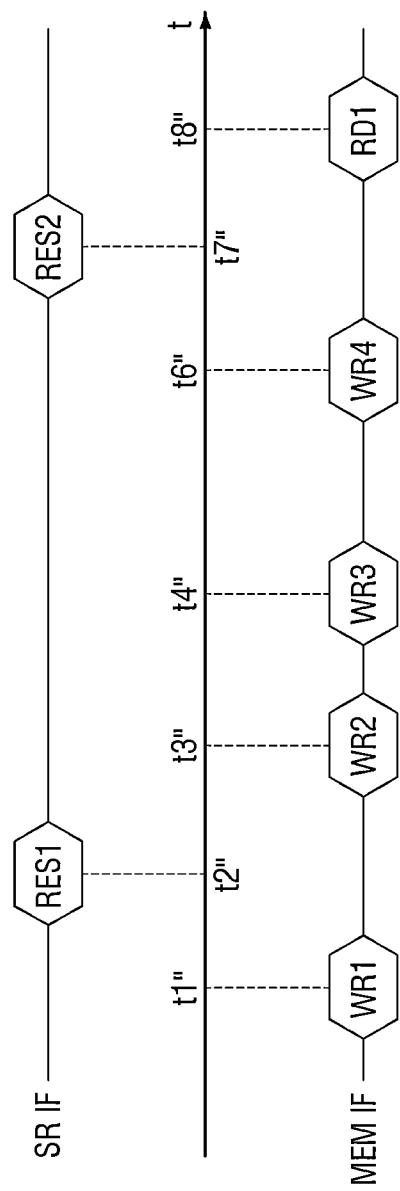
FIG. 9 is a timing diagram for explaining the operation of the electronic device according to some example embodiments.

Referring to FIG. 9, the plurality of response signals RES1 and RES2 may be transferred through the serial interface SR IF, and the plurality of signals WR1, WR2, WR3, WR4, and RD1 may be transferred through the memory interface MEM. Different signals of each interface may be transferred to each other without being limited to the timing. For example, the plurality of response signals RES1 and RES2 may be transferred at second and seventh hours t2" and t7", and the plurality of signals WR1, WR2, WR3, WR4, and RD1 may be transferred at first time, third to sixth times, and eighth time t1", t3" to t6", and t8".

Figure 10:
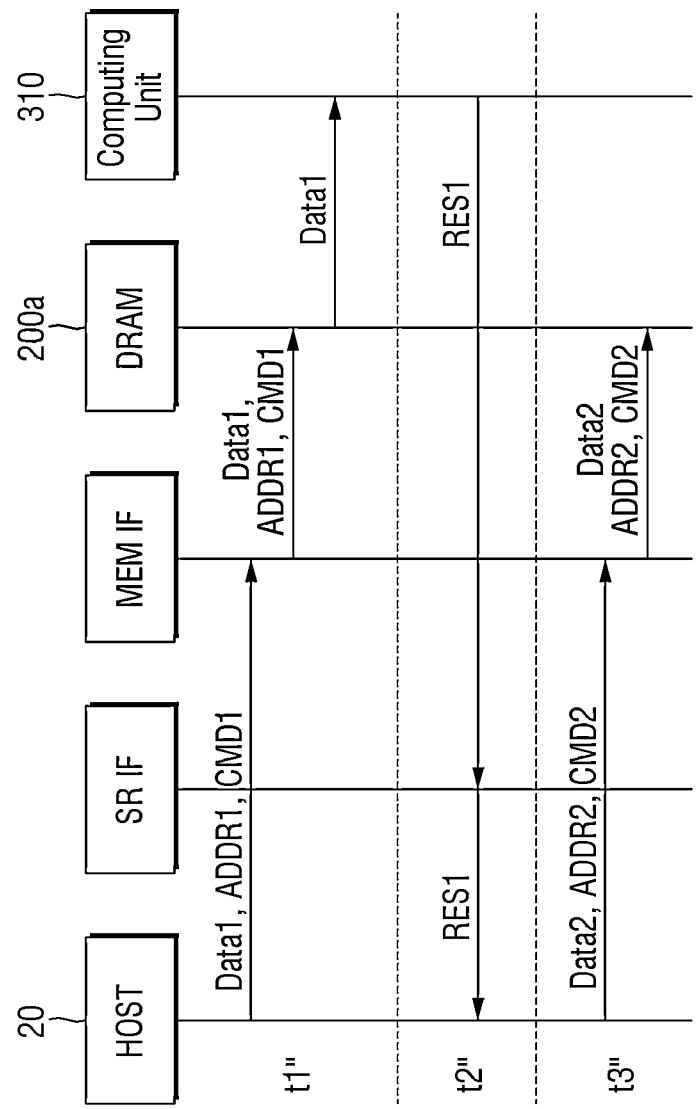
FIG. 10 is a ladder diagram for explaining the operation of the electronic device according to some example embodiments.

Referring to FIG. 10, at the first time t1", the first data signal Data1, the first address ADDR1, and the first command CMD1 may be transferred to the memory device 200a through the memory interface MEM IF. Further, the first data signal Data1 stored in the memory device 200a may be provided to the computing unit 310.

The computing unit 310 may perform the computing on the first data signal Data1 at the second time t2" subsequent to the first time t1" to output the first response signal RES1. For example, the computing unit 310 may generate the first response signal RES1 in response to the first data signal Data1. The computing unit 310 explained referring to FIGS. 8 to 10 may output the first response signal RES1 using only the first data signal Data1, even if the computing command CMDC is not received from the host 20. Because the time for transferring the computing command CMDC is not consumed, the computing unit 310 may more quickly output the response signal RES. Further, the first response signal RES1 or the second response signal RES2 is not dependent upon the data signal Data and may be output periodically. Further, at the third time t3", the second data signal Data2, the second address ADDR2, and the second command CMD may be transferred to the memory device 200a. For example, the host 20 may output the second data signal Data2, the second address ADDR2, and the second command CMD in response to the received first response signal RES1.

Hereinafter, the electronic device 1 according to some example embodiments will be explained referring to FIGS. 11 to 12.

Figure 11:
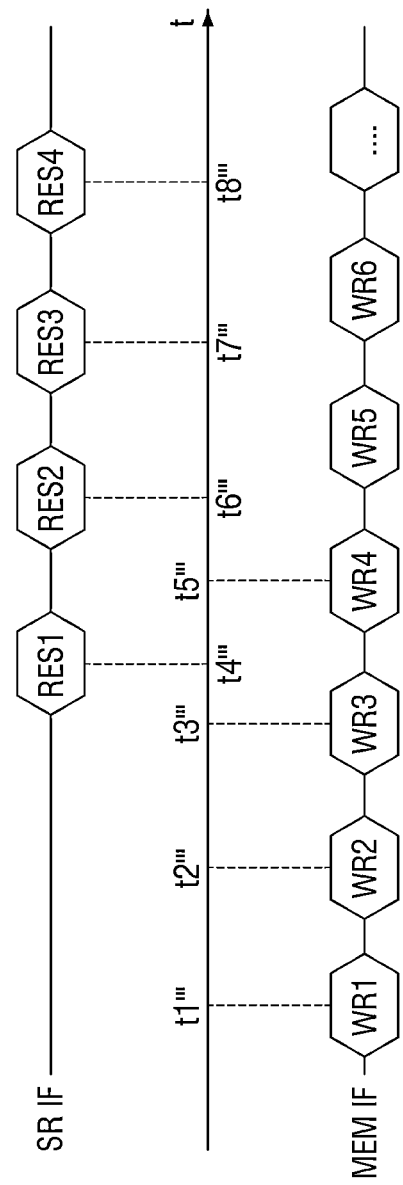
FIG. 11 is a timing diagram for explaining the operation of the electronic device according to some example embodiments.

FIG. 11 is a timing diagram for explaining the operation of the electronic device according to some example embodiments. FIG. 12 is a ladder diagram for explaining the operation of the electronic device according to some example embodiments. For convenience of explanation, repeated parts of contents explained using FIGS. 1 to 10 will be briefly explained or omitted.

Figure 12:
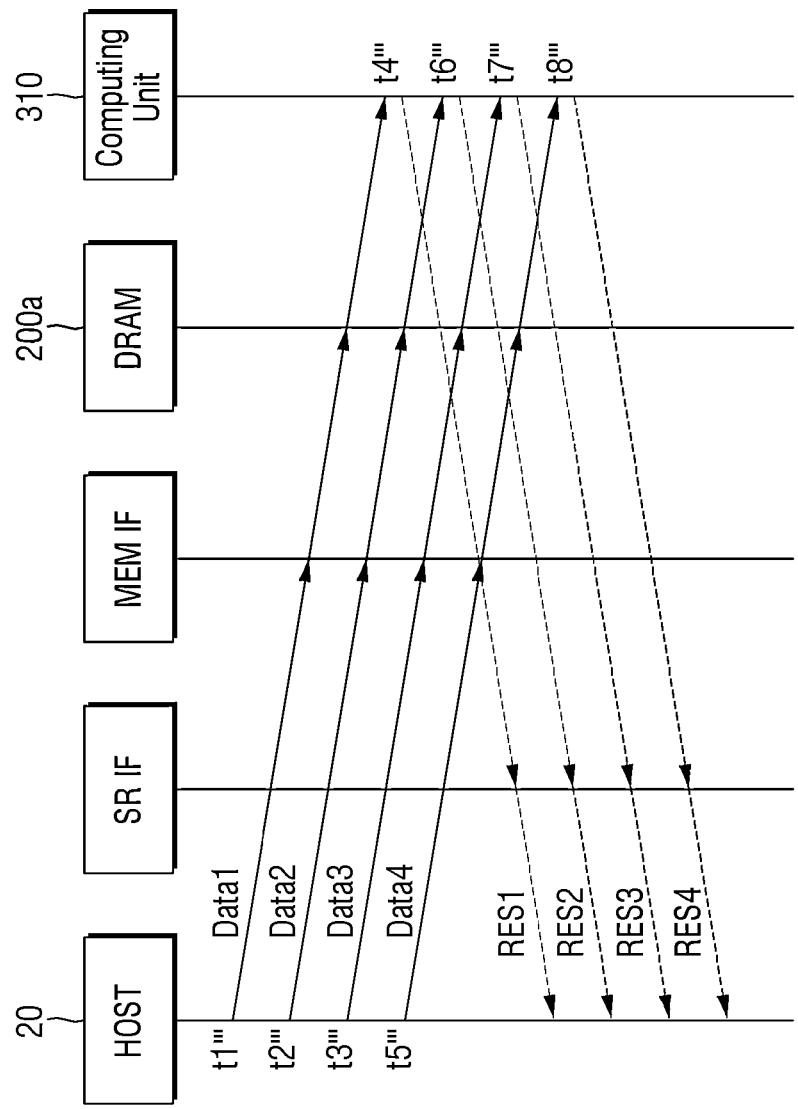
FIG. 12 is a ladder diagram for explaining the operation of the electronic device according to some example embodiments.

Referring to FIGS. 11 and 12, a plurality of signals WR1 to WR6 may be transferred through the memory interface MEM IF, and a plurality of response signals RES1 to RES4 may be transferred through the serial interface SR IF. Although a specific number of plurality of signals WR1 to WR6 and a plurality of response signals RES1 to RES4 are shown in the drawings, example embodiments of inventive concepts are not limited thereto. For example, the response signal transferred through the serial interface SR IF may be output to correspond to the signal transferred through the memory interface MEM IF. For example, when the number of the signals transferred through the memory interface MEM IF is eight, the number of response signals transferred through the serial interface SR IF may also be eight.

In some example embodiments, the first signal WR1 may be transferred through the memory interface MEM IF at the first time t1''', the second signal WR2 may be transferred through the memory interface MEM IF at the second time t2''', the third signal WR3 may be transferred through the memory interface MEM IF at the third time t3''', and the fourth signal WR4 may be transferred through the memory interface MEM IF at the fifth time t5'''. Also, the first response signal RES1 may be transferred through the serial interface SR IF at the fourth time t4''', the second response signal RES2 may be transferred through the serial interface SR IF at the sixth time t6''', the third response signal RES3 may be transferred through the serial interface SR IF at the seventh time t7''', and the fourth response signal RES4 may be transferred through the serial interface SR IF at the eighth time t8′″. Here, the first to eighth times t1′″ to t8′″ may be listed in the time series.

Referring to FIG. 12, the first data signal Data1 may be transferred from the host 20 to the computing unit 310 through the memory interface MEM IF and the memory device 200a at the first time t1′″. The first response signal RES1 that is output from the computing unit 310 in response to the first data signal Data1 may be transferred from the computing unit 310 to the host 20 through the serial interface SR IF at the fourth time t4′″. Here, the time when the first data signal Data1 is output from the host 20 may be different from the time when the first data signal Data1 reaches the computing unit 310, and the time when the first response signal RES1 is output from the computing unit 310 may be different from the time when the first response signal RES1 reaches the host 20. The second to fourth data signals Data2 to Data4 and the second to fourth response signals RES2 to RES4 may be output at different times, like the first data signal Data1 and the first response signal RES1, and may reach the host 20 or the computing unit 310 at different times.

The host 20 may output, e.g. may continuously output a plurality of data signals, and the computing unit 310 may output a plurality of continuous response signals in response to the plurality of continuous data signals. For example, the electronic device 1 including the host 20 and the computing unit 310 may perform continuous processing on continuous data signals and receive continuous response signals thereof. For example, the host 20 may receive a real-time response to the data signal to be input.

Because the plurality of data signals Data1 to Data4 are transferred through the memory interface MEM IF, and the plurality of response signals RES1 to RES4 are transferred through the serial interface SR IF, each signal may be transferred at independent timing. As a result, the time when the plurality of data signals Data1 to Data4 are transferred, and the time when the plurality of response signals RES1 to RES4 are transferred may overlap each other.

Hereinafter, the electronic device 1 according to some example embodiments will be explained referring to FIG. 13.

Figure 13:
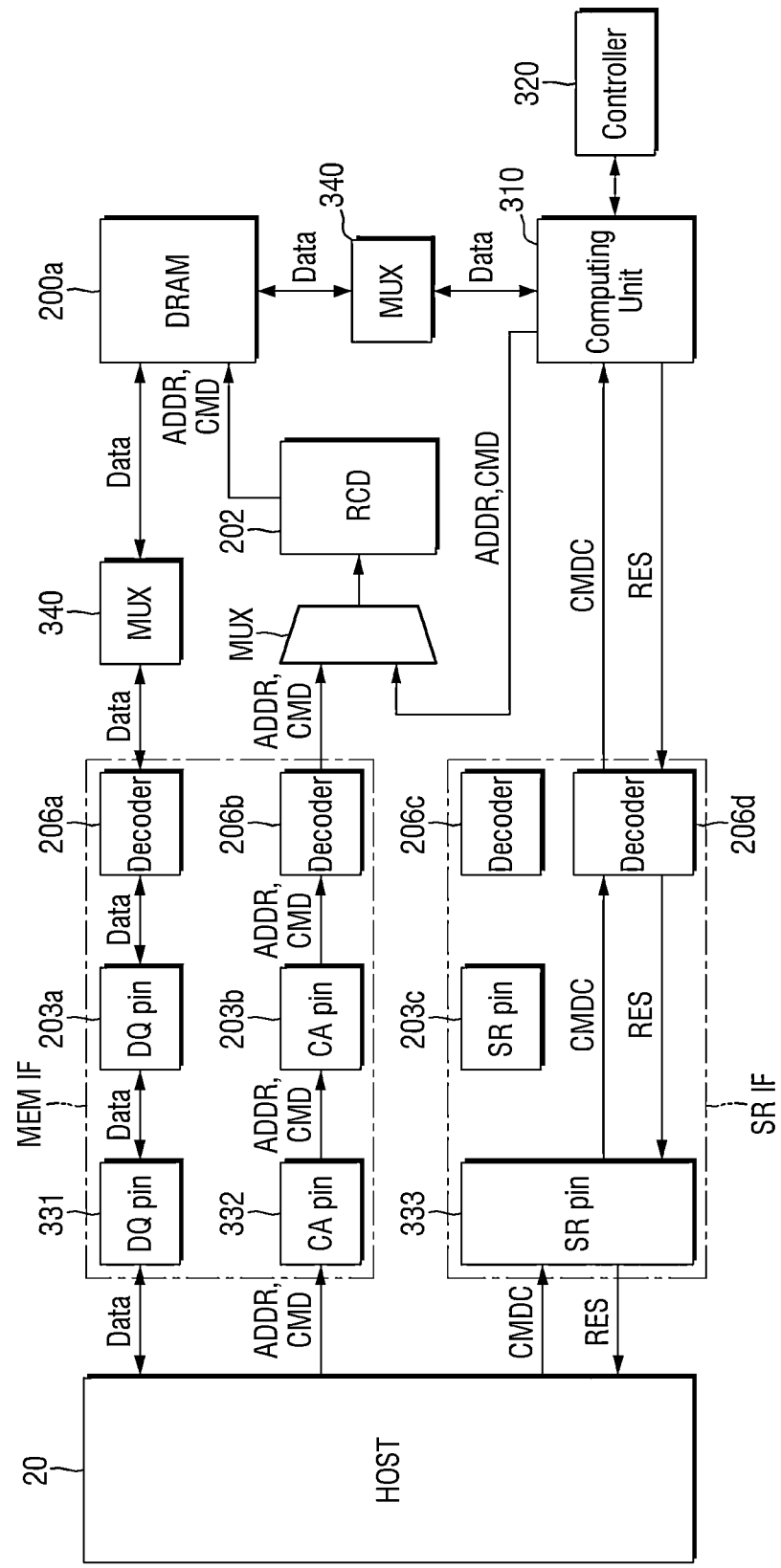
FIG. 13 is a block diagram of an electronic device according to some example embodiments.

FIG. 13 is a block diagram of an electronic device according to some example embodiments. For convenience of explanation, repeated parts of contents explained using FIGS. 1 to 12 will be briefly explained or omitted.

Referring to FIG. 13, a computing device 300 may include a multiplexer 340. The multiplexer 340 may connect the decoder 206a and the memory device 200a, and may also connect the computing unit 310 and the memory device 200a. Although the two multiplexer 340 are represented, this is just for illustrative purposes only, and one multiplexer 340 may be implemented.

The multiplexer 340 may transfer the data signal Data output from the decoder 206a to the memory device 200a, and may transfer the data signal Data output from the memory device 200a to the decoder 206a. For example, the multiplexer 340 may connect the memory device 200a and the memory interface MEM IF and selectively transmit and receive the data.

Further, the multiplexer 340 may transfer the data signal Data output from the memory device 200a to the computing unit 310, and may transfer the data signal Data output from the computing unit 310 to the memory device 200a. The multiplexer 340 may connect the memory device 200a and the computing unit 310 and selectively transmit and receive the data.

Hereinafter, the electronic device 1 according to some example embodiments will be explained referring to FIG. 14.

Figure 14:
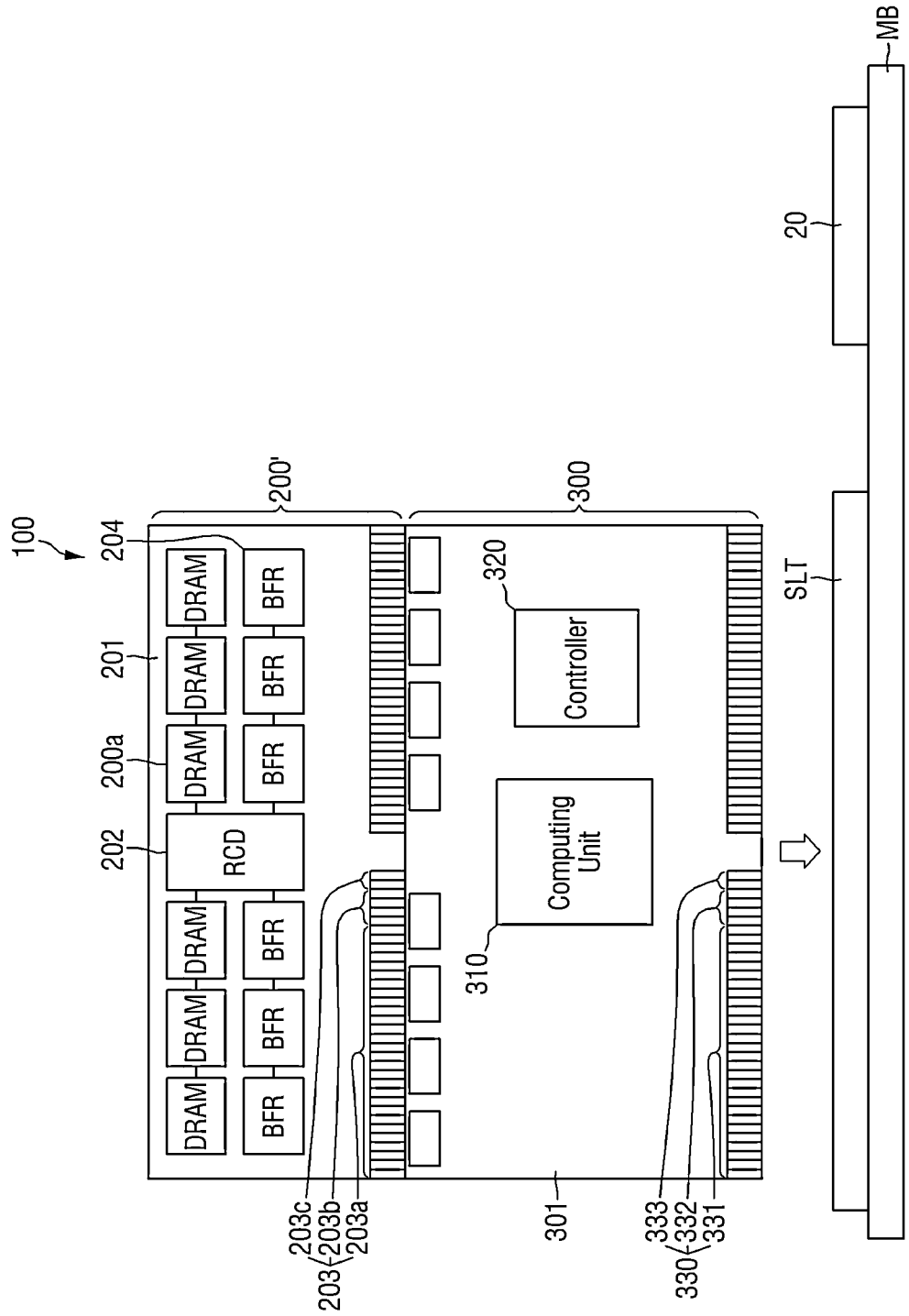
FIG. 14 is a diagram for explaining an electronic device according to some example embodiments.

FIG. 14 is a diagram for explaining an electronic device according to some example embodiments. For convenience of explanation, repeated parts of contents explained using FIGS. 1 to 13 will be briefly described or omitted.

Referring to FIG. 14, a semiconductor device 100 may include a memory device 200′, and a computing device 300 connected to the memory device 200′. The memory device 200′ may include a buffer 204. The buffer 204 may be placed on the substrate 201 to correspond to each memory device 200a. For example, the number of buffers 204 may be the same as the number of memory devices 200a. The buffer 204 may be connected to each memory device 200a. Further, the buffer 204 is connected to the register clock driver 202, and may receive the plurality of signals from the register clock driver 202.

The buffer 204 is connected to the data pin 203a and may receive the data signal Data from the host 20 through the data pin 203a, and may buffer the received data signal Data and transfer it to the memory device 200a. As a result, the electrical load of the memory device 200a may be reduced. A memory device 200′ may be referred to as a LRDIMM (Load Reduced DIMM).

Hereinafter, the electronic device 1 according to some example embodiments will be explained referring to FIG. 15.

Figure 15:
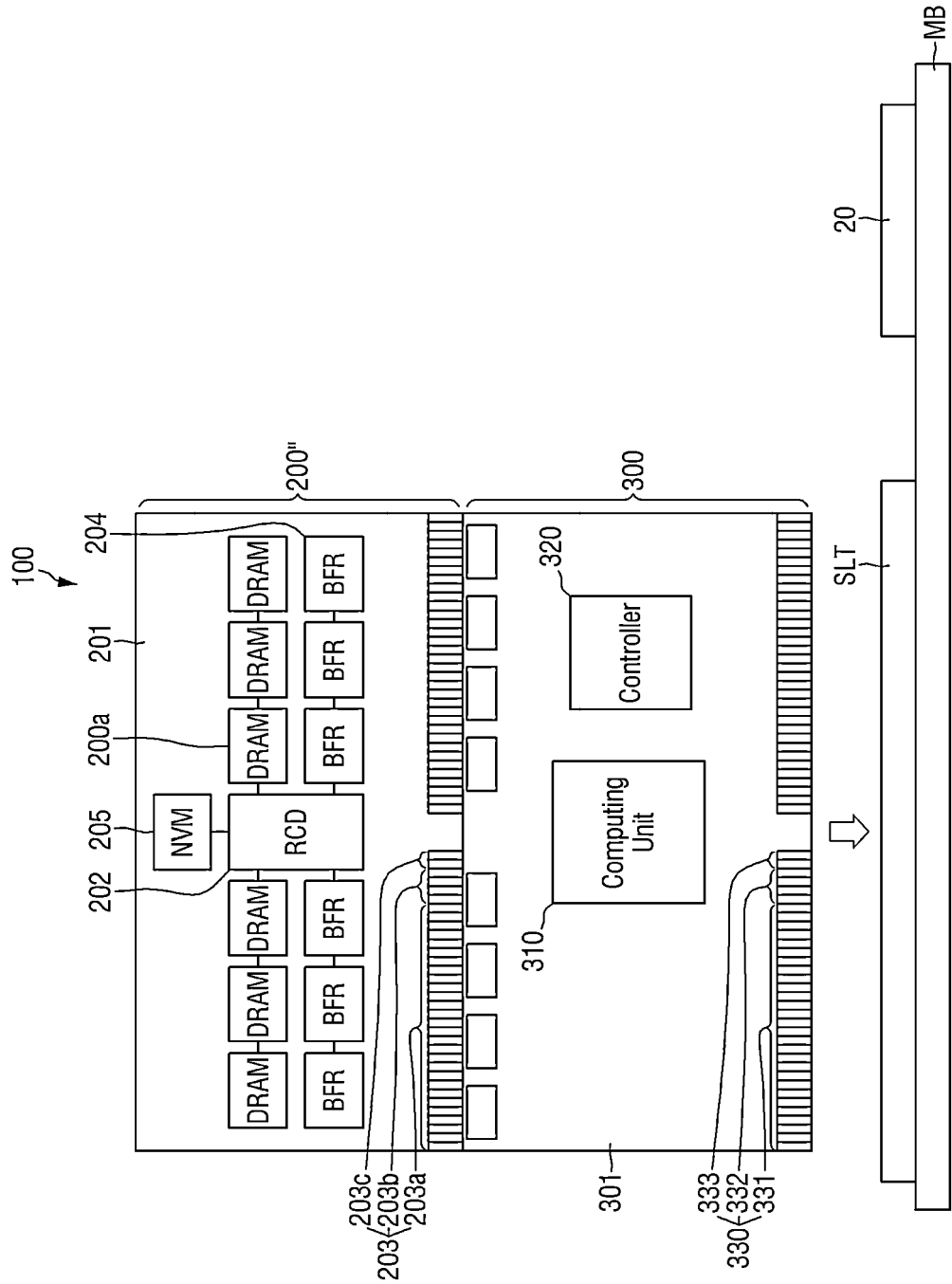
FIG. 15 is a diagram for explaining an electronic device according to some example embodiments.

FIG. 15 is a diagram for explaining an electronic device according to some example embodiments. For convenience of explanation, repeated parts of contents explained using FIGS. 1 to 14 will be briefly described or omitted.

Referring to FIG. 15, the semiconductor device 100 may include a memory device 200″, and a computing device 300 connected to the memory device 200″. The memory device 200″ may include a non-volatile memory 205. The non-volatile memory 205 may be connected to the register clock driver 202. However, the embodiment of inventive concepts is not limited thereto, and the non-volatile memory 205 may also be connected to each memory device 200a.

The non-volatile memory 205 may store the data transferred from the host 20 or the memory device 200a. While the memory device 200a is a volatile memory, the memory stored in the non-volatile memory 205 may be maintained. For example, since the memory device 200″ includes the non-volatile memory 205, the data may be stored and maintained in the non-volatile memory 205, even in a state in which the power applied to the memory device 200″ is turned off.

Hereinafter, an electronic device 1 according to some example embodiments will be explained referring to FIG. 16.

Figure 16:
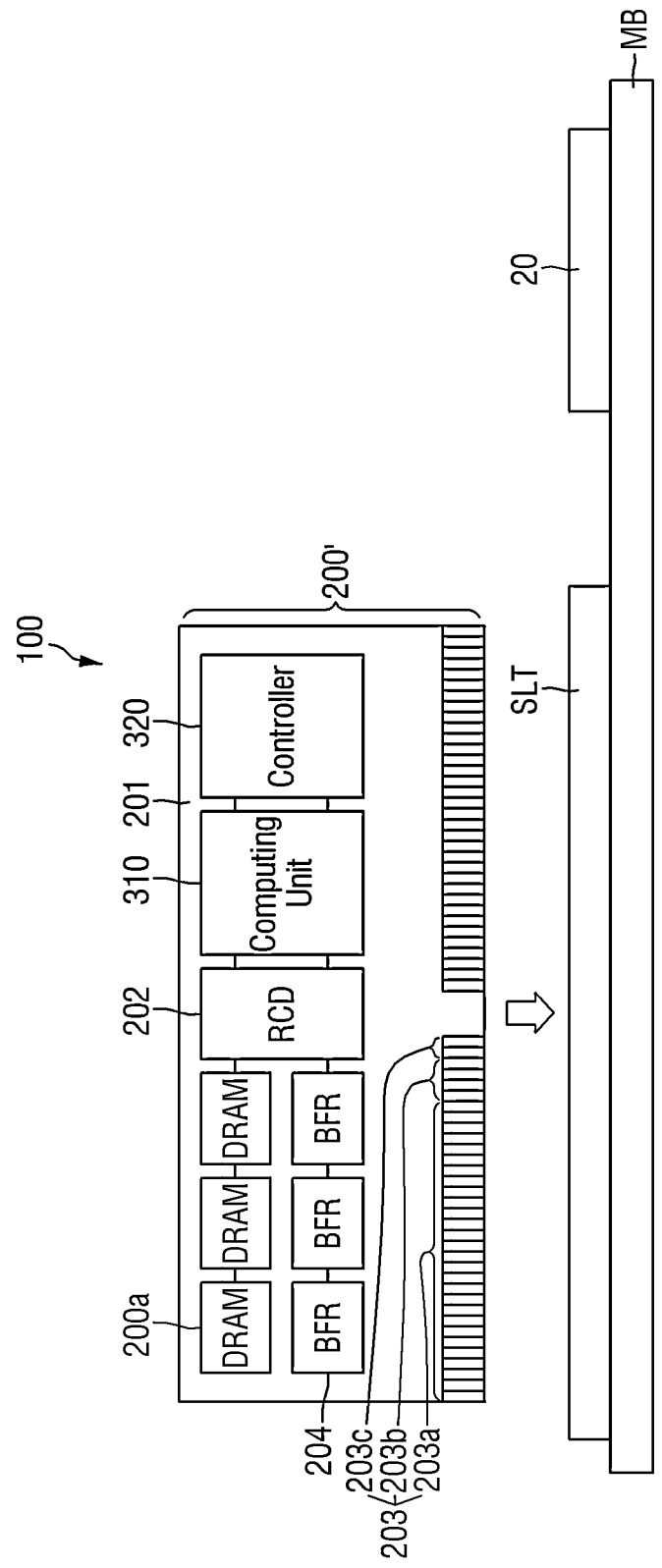
FIG. 16 is a diagram for explaining an electronic device according to some example embodiments.

FIG. 16 is a diagram for explaining an electronic device according to some example embodiments. For convenience of explanation, repeated parts of contents explained using FIGS. 1 to 15 will be briefly described or omitted.

Referring to FIG. 16, the semiconductor device 100 may include a memory device 200′″. For example, the semiconductor device 100 explained referring to FIGS. 1 to 15 includes the computing device 300, whereas the semiconductor device 100 explained referring to FIG. 16 may not include the computing device 300. The memory device 200′″ may include a substrate 201, a register clock driver 202, a connecting pin 203, a memory device 200a, a buffer 204, a computing unit 310, and a controller 320. The computing unit 310 and the controller 320 are not placed on other substrates, but may be mounted on the substrate 201 on which the memory device 200*a* is placed.

The memory device 200*a* and the buffer 204 may be mounted on one side of the substrate 201, and the computing unit 310 and the controller 320 may be mounted on the other side of the substrate 201. Both the memory device 200*a* and the computing unit 310 may operate by being connected to the register clock driver 202. The memory device 200*a* may receive the signal transferred through the memory interface MEM IF, and the computing unit 310 may receive the signal transferred through the serial interface SR IF. At this time, both the memory interface MEM IF and the serial interface SR IF may be implemented by the memory devices 200′″. However, example embodiments of inventive concepts are not limited thereto.

Example embodiments are not limited to those discussed above. Furthermore none of the example embodiments discussed above are necessarily mutually exclusive with one another. For example, some example embodiments may include some features described with reference to one or more figures, and may also include some features described with reference to other figures.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In concluding the detailed description, those of ordinary skill in the art will appreciate that many variations and modifications may be made to the preferred embodiments without substantially departing from the principles of inventive concepts. Therefore, the disclosed preferred embodiments of the invention are used in a generic and descriptive sense only and not for purposes of limitation.

What is claimed is:

1. A semiconductor device comprising:
    a memory interface including at least one data pin configured to transfer a data signal and at least one command address pin configured to transfer a command and an address;
    a serial interface including at least one serial pin configured to transfer a serial data signal; and
    processing circuitry connected to the at least one data pin and the at least one serial pin, wherein
    the processing circuitry is configured to receive the data signal from outside through the at least one data pin,
    the processing circuitry is configured to output the serial data signal through the at least one serial pin in response to the received data signal, and
    the memory interface and the serial interface are configured to at least partially concurrently transfer the respective data signal, command and address, and serial data signal.

2. The semiconductor device of claim 1, further comprising:
    a memory device connected to the at least one data pin and the at least one command address pin,
    wherein the memory device is configured to receive the data signal through the at least one data pin, is configured to receive the command through the at least one command address pin, is configured to receive the address through the at least one command address pin, and is configured to store the data signal based on the command and the address.

3. The semiconductor device of claim 2, wherein the memory device is configured to provide the stored data signal to the processing circuitry.

4. The semiconductor device of claim 2, wherein the memory device is not directly connected to any of the at least one serial pin.

5. The semiconductor device of claim 2, wherein the at least one serial pin is configured to output the serial data signal without going through the memory device.

6. The semiconductor device of claim 2, wherein the memory device includes a DIMM (dual in-line memory module).

7. The semiconductor device of claim 2, further comprising:
    a multiplexer configured to connect the memory device with the processing circuitry, and is configured to transfer the stored data signal to the processing circuitry.

8. The semiconductor device of claim 1, wherein the processing circuitry is directly connected to the at least one serial pin.

9. The semiconductor device of claim 1, wherein the processing circuitry is configured to receive a computing command from the outside through the at least one serial pin, and to generate the serial data signal based on the received computing command and the data signal.

10. The semiconductor device of claim 1, wherein the semiconductor device is configured to decode the serial data signal according to at least one of an I2C or an I3C protocol.

11. The semiconductor device of claim 1, wherein a first bandwidth of the serial data signal is less than a second bandwidth of the data signal.

12. A semiconductor device comprising:
    a memory device;
    at least one data pin configured to transfer a first data signal from outside to the memory device during a first time interval;
    processing circuitry configured to receive the first data signal from the memory device; and
    at least one serial pin configured to transfer a computing command from the outside to the processing circuitry during a second time interval,
    wherein the processing circuitry is configured to output a response signal based on the received first data signal and the computing command, and
    at least some of the first time interval and the second time interval overlap each other.

13. The semiconductor device of claim 12, wherein the at least one data pin is configured to transfer a second data signal received from the outside to the memory device during a third time interval subsequent to the first time interval, and
    the processing circuitry is configured to receive the second data signal from the memory device.

14. The semiconductor device of claim 13, wherein the at least one serial pin is configured to transfer a response signal that is output from the processing circuitry, the response signal output form the processing circuitry during a fourth time interval, and at least some of the third time interval and the fourth time interval overlap each other.

15. The semiconductor device of claim 12, wherein the memory device includes a DIMM (dual in-line memory module).

16. The semiconductor device of claim 12, wherein the processing circuitry is directly connected to the at least one serial pin.

17. The semiconductor device of claim 12, wherein a first bandwidth of the response signal is less than a second bandwidth of the first data signal.

18. An electronic device comprising:

a host;

first processing circuitry connected to the host; and a memory device connected to the first processing circuitry, wherein the first processing circuitry includes at least one first data pin configured to receive a data signal from the host, a first interfacing device circuitry configured to receive a serial data signal from the host and to decode the serial data signal, and a computing processing circuitry configured to receive the decoded serial data signal from the first interfacing circuitry, and the memory device includes a second interfacing device circuitry connected to the at least one first data pin and is configured to receive the data signal from the first data pin and to decode the data signal, and a memory module configured to receive the decoded data signal from the second interfacing device circuitry, to store the decoded data signal, and to provide the stored data signal to the computing processing circuitry, and the computing processing circuitry is configured to output a response signal based on the received data signal and the serial data signal.

19. The electronic device of claim 18, wherein the first interfacing device circuitry and the second interfacing device circuitry are configured to decode signals according to protocols different from each other.

20. The electronic device of claim 18, wherein a first bandwidth of the serial data signal is less than a second bandwidth of the data signal.

* * * * *